United States Patent
Tsai et al.

(10) Patent No.: US 6,403,469 B1
(45) Date of Patent: Jun. 11, 2002

(54) METHOD OF MANUFACTURING DUAL DAMASCENE STRUCTURE

(75) Inventors: Teng-Chun Tsai, Hsinchu; Hsueh-Chung Chen, Taipei Hsien; Ming-Sheng Yang, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/660,071

(22) Filed: Sep. 12, 2000

(30) Foreign Application Priority Data

Aug. 31, 2000  (TW) ..................... 89117744 A (51) Int. Cl.⁷ ................. H01L 21/4763; H01L 21/44
(52) U.S. Cl. .............. 438/633; 438/622; 438/627; 438/638; 438/653; 438/666; 438/687
(58) Field of Search ................. 438/633, 622, 438/623, 627, 638, 636, 637, 648, 653, 656, 672, 685, 687, 660, 668, 666

(56) References Cited

U.S. PATENT DOCUMENTS 5,970,376 A * 10/1999 Chen ..................... 438/637
6,140,226 A * 10/2000 Grill et al. ............... 438/637
6,258,711 B1 * 7/2001 Laursen ................... 438/633

* cited by examiner

Primary Examiner—Caridad Everhart
Assistant Examiner—Igwe U. Anya (57) ABSTRACT

A method of producing a dual damascene structure. A substrate is provided and an insulation layer is formed over the substrate. A dual damascene opening is formed in the insulation layer. A liner layer is formed over the exposed surface of the dual damascene opening. Metallic material is deposited over the substrate filling the dual damascene opening to form a metallic layer. A cap layer is formed over the metallic layer. A chemical-mechanical polishing operation is carried out to polish the cap layer using a metal-reactive solution or a cap-layer-reactive solution. The polishing operation continues until the cap layer outside the dual damascene opening is completely removed and the metallic layer is exposed. A portion of the cap layer remains above the dual damascene opening. Using the retained cap layer as a protective layer for the metallic layer, the metallic layer outside the dual damascene opening is removed by polishing until the liner layer is exposed. Lastly, the liner layer is removed to form a slightly protruding metal line structure.

12 Claims, 7 Drawing Sheets

METHOD OF MANUFACTURING DUAL DAMASCENE STRUCTURE

CROSS-REFERENCE TO RELATED APPLICATION

This application claims the priority benefit of Taiwan application serial no. 89117744, filed Aug. 31, 2000.

BACKGROUND OF THE INVENTION

1. Field of Invention

The present invention relates to a semiconductor manufacturing process. More particularly, the present invention relates to a method of manufacturing a dual damascene structure.

2. Description of Related Art

As semiconductor manufacturing reaches the deep submicron stage, dual damascene processing and associated techniques such as copper-filling and chemical-mechanical polishing becomes indispensable.

To cram large number of metallic interconnects on a limited chip surface, a multiples of metallic layer are often formed on a silicon chip. Earlier method of manufacturing a multiple of metallic layers includes the steps of providing a substrate having a first metal line layer thereon, forming an inter-metallic dielectric layer over the substrate, forming a via opening that exposes a portion of the first metal line in the inter-metal dielectric layer, depositing conductive material into the via opening to form a via plug, depositing a second metallic layer over the inter-metallic dielectric layer, and carrying out conventional photolithographic and etching processes to pattern the metallic layer into a second metal line layer. However, some defects may result from metal layer patterning process because of the difficulties in controlling dry etching. Consequently, a dual damascene processing method is invented. In dual damascene processing, an inter-metallic dielectric layer is formed over a substrate having a metal line thereon. Since an inter-metal dielectric layer has a higher etching rate than a metallic layer, a via opening that exposes the metal line and a shallow trench for forming upper layer metal line can be easily formed in the dielectric layer. A liner layer is formed over the exposed surface of the dual damascene opening. Metallic material is deposited into the dual damascene opening so that a via plug and an upper metal line are formed at the same time. Excess metal outside the dual damascene opening is removed by polishing using a metal-reactive solution to expose liner layer is exposed. Finally, the liner layer is removed by polishing using a liner-material-reactive solution to form a dual damascene structure.

However, once the metal layer above the liner layer is removed in a conventional chemical-mechanical polishing process, a portion of the metal inside the dual damascene structure will be removed as well. This is because liner material has a lower polishing rate than metal when the metallic layer is polished with a metal-reactive reagent. Hence, the upper metal line generally has a dishing surface that result from over-polishing.

Figure 1:
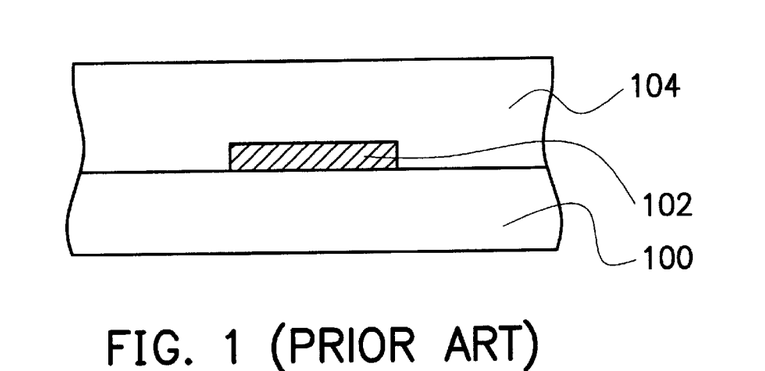
FIGS. 1 through 3 are cross-sectional views showing the progression of steps for forming a dual damascene structure in a conventional dual damascene process.
Figure 2:
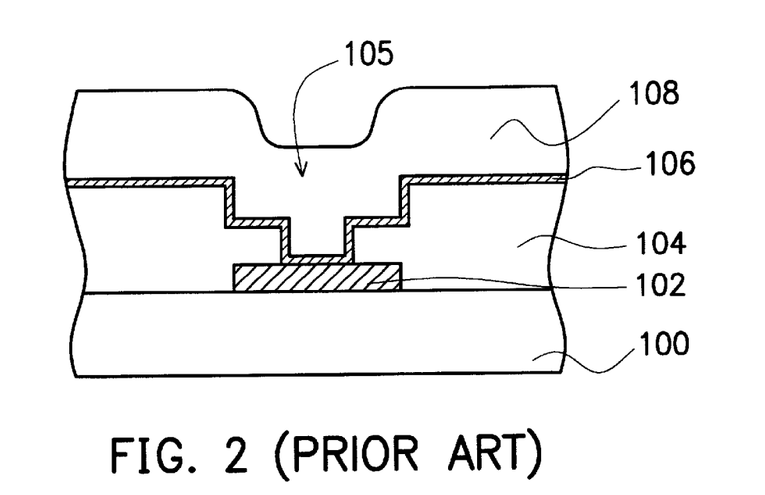
Figure 3:
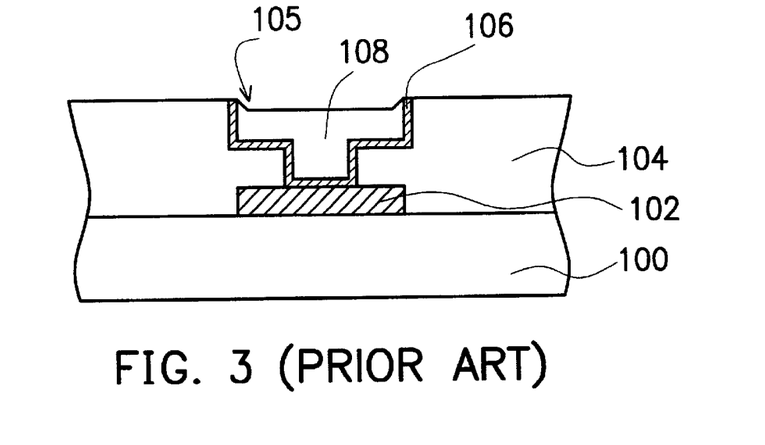

FIGS. 1 through 3 are cross-sectional views showing the progression of steps for forming a dual damascene structure in a conventional dual damascene process.

As shown in FIG. 1, a substrate 100 is provided. A metal line 102 is formed above the substrate 100 and then an insulation layer 104 such as a silicon dioxide layer is formed over the substrate 100.

As shown in FIG. 2, photolithographic and etching processes are carried out in sequent to form a dual damascene opening 105 in the insulation layer 104. A liner layer 106 such as a titanium/titanium nitride layer is deposited over the exposed surface of the dual damascene opening 105. Copper is deposited over the substrate 100 and filled the opening 105 to form a copper layer 108.

As shown in FIG. 3, excess copper outside the dual damascene opening 105 is removed by polishing using a copper-reactive solution to expose the liner layer 106. Finally, the liner layer 106 outside the dual damascene structure is removed by polishing using a liner-material-reactive solution.

After a conventional chemical-mechanical polishing operation, a dish surface may form on the upper portion of a metal line. Dishing may be more serious for metal lines having a somewhat wider line width. Dishing occurs because liner material has a lower polishing rate than metallic material. Hence, metal on the dual damascene structure is removed faster than the liner layer on each side leading to over-polishing.

Because a conventional dual damascene process tends to lower thickness of metal lines through dishing, cross-sectional area of a metal line is reduced and hence corresponding resistance for a piece of the metal line is increased.

SUMMARY OF THE INVENTION

Accordingly, one object of the present invention is to provide a method of fabricating a dual damascene structure capable of preventing the dishing of metal lines.

To achieve these and other advantages and in accordance with the purpose of the invention, as embodied and broadly described herein, the invention provides a method of fabricating a dual damascene structure. A substrate is provided and then an insulation layer is formed over the substrate. A dual damascene opening is formed in the insulation layer. A liner layer is formed over the exposed surface of the dual damascene opening. Metallic material is deposited over the substrate filling the dual damascene opening to form a metallic layer. A cap layer is formed over the metallic layer. Due to the presence of the dual damascene opening, the cap layer above the dual damascene structure is at a level lower than surrounding region. Cap layer outside the dual damascene opening region is removed by polishing using a cap-material-reactive solution. A portion of the metallic layer is removed by polishing using a metal-reactive solution until the cap layer above the dual damascene structure is exposed. The polishing is continued to remove metal outside the dual damascene structure until the liner layer is exposed. Finally, the liner layer and the cap layer are removed.

According to the embodiment of this invention, the polishing rate of cap layer material must be smaller than the metal material when the metallic layer is polished using a metal-reactive solution. Hence, the metal in the dual damascene structure is protected from over-polishing, thereby preventing dishing of metal lines.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 4, 5, 6a, 6b and 7 are cross-sectional views showing the progression of steps for forming a dual damascene structure according to a first preferred embodiment of this invention.

FIGS. 8, 9, 10, 11a, 11b and 12 are cross-sectional views showing the progression of steps for forming a dual damascene structure according to a second preferred embodiment of this invention, FIGS. 13, 14, 15, 16a and 16b are cross-sectional views showing the progression of steps for forming a dual damascene structure according to a third preferred embodiment of this invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 4 through 7 are cross-sectional views showing the progression of steps for forming a dual damascene structure according to a first preferred embodiment of this invention.

Figure 4:
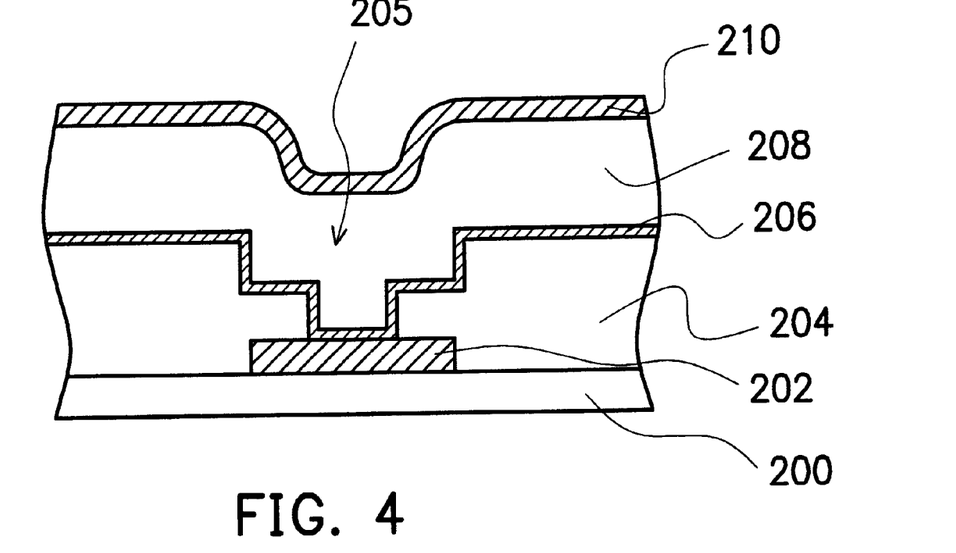

As shown in FIG. 4, a substrate 200 is provided. A metal line 202 is formed over the substrate 200 and an insulation layer 204 is formed over the substrate 200. The insulation layer 204 can be a silicon dioxide layer formed, for example, by plasma-enhanced chemical vapor deposition (PECVD). Photolithographic and etching processes are next conducted in sequence to form a dual damascene opening 205 in the insulation layer 204. A liner layer 206 is formed over the exposed surface of the dual damascene opening 205. The liner layer 206 can be a titanium/titanium-nitride composite layer or a tantalum/tantalum-nitride composite layer. The composite layer is formed, for example, by depositing titanium or tantalum over the opening 205 through a DC magnetron sputtering machine and then performing a nitridation reaction to form a titanium nitride or tantalum nitride layer. In the subsequent step, metal is deposited over the liner layer 206 filling the dual damascene opening 205 to form a metallic layer 208. The metallic layer 208 can be a copper layer, for example. A cap layer 210 is formed over the metallic layer 208. Due to the presence of the dual damascene opening 205, the cap layer 210 above the dual damascene opening 205 is at a level lower than the cap layer 210 around the opening 205.

The cap layer 210 can be produced using materials such as polysilicon, silicon dioxide, silicon nitride, silicon carbide, metals or low dielectric constant materials such as parylene N, polynaphthalene-N and fluorinated hydrocarbon. However, the polishing rate of the cap layer 210 must be considerably lower than the metallic layer 208 when the metallic layer is polished using a metal-reactive solution.

Figure 5:
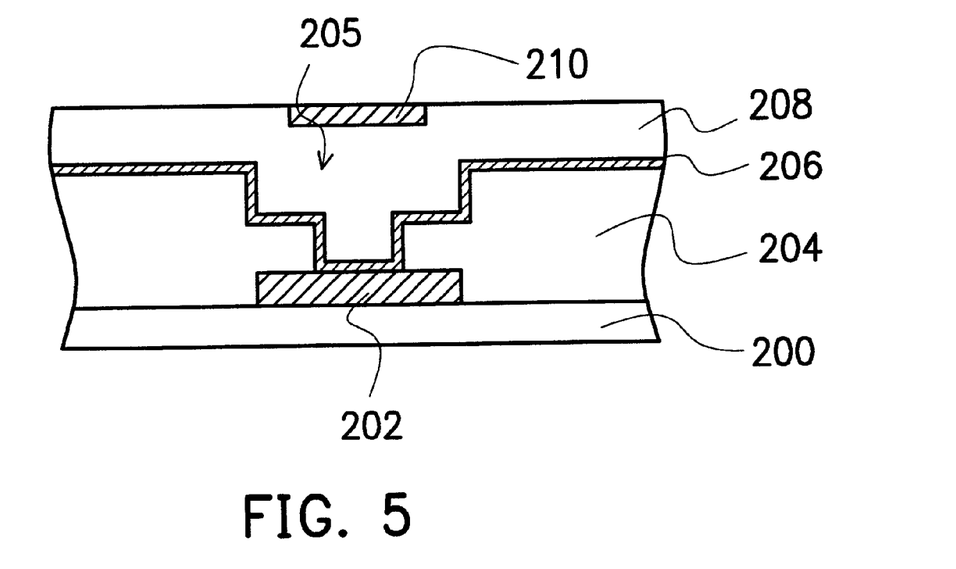

As shown in FIG. 5, a portion of the cap layer 210 lying outside the dual damascene opening 205 is removed to expose the metallic layer 208 using a metal-reactive solution. The polishing process is continued using the same metal-reactive solution until the metallic layer 208 is at the same height level as the top of the cap layer 210. Since the cap layer 210 has a lower polishing rate than the metallic layer 208, the metallic layer 208 under the retained cap layer 210 is protected from polishing action. Through the protective cap layer 210, dishing at the top of the metallic layer 208 due to over-polishing can be prevented.

Figure 6A:
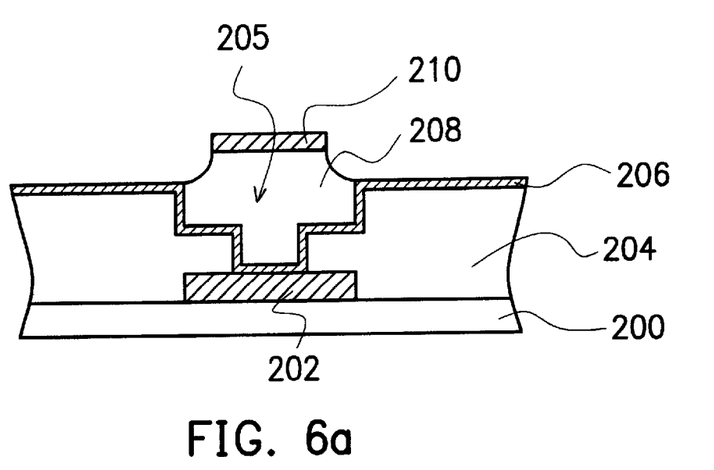
FIG. 6a shows the structure after polishing with a polishing solution having a high polishing selectivity ratio between the metal layer and the cap layer and hence a portion of the cap layer is retained.
Figure 6B:
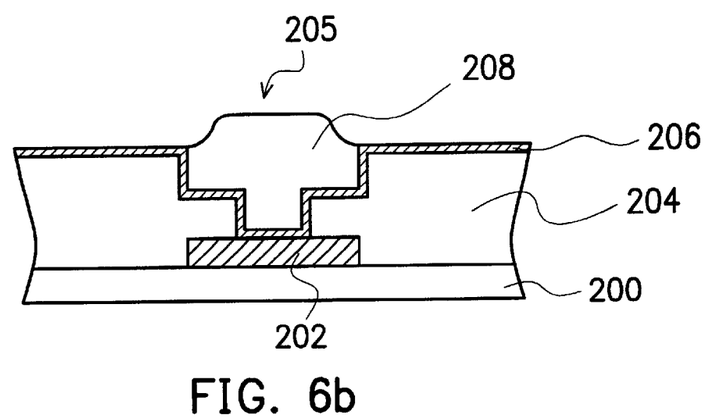
FIG. 6b shows the structure after polishing with a polishing solution having a low polishing selectivity ratio between the metal layer and the cap layer and hence the cap layer is completely removed.

As shown in FIGS. 6a and 6b, the polishing process is continued using metal-reactive solution so that the metallic layer 208 lying outside the cap layer 210 is removed. The polishing process stops when the liner layer 206 is exposed. Due to the difference in polishing selectivity between the metallic layer 208 and the cap layer 210, one of two conditions may occur when the liner layer 206 is exposed. If the polishing selectivity ratio between the metallic layer 208 and the cap layer 210 is very high, only a portion of the cap layer 210 will be removed as shown in FIG. 6a. Under such circumstances, an addition step of removing the remaining cap layer 210 to form a protruding metal line structure is required. The cap layer 210 can be removed, for example, by wet etching using a reactant that has a high etching selectivity between the cap layer 210 and the liner layer 206. On the other hand, if the polishing selectivity ratio between the metallic layer 208 and the cap layer 210 is moderate to low, the cap layer 210 will be completely removed. In some cases, a portion of the metallic layer 208 underneath the cap layer 210 is removed similarly forming a protruding metal line structure as shown in FIG. 6b.

Figure 7:
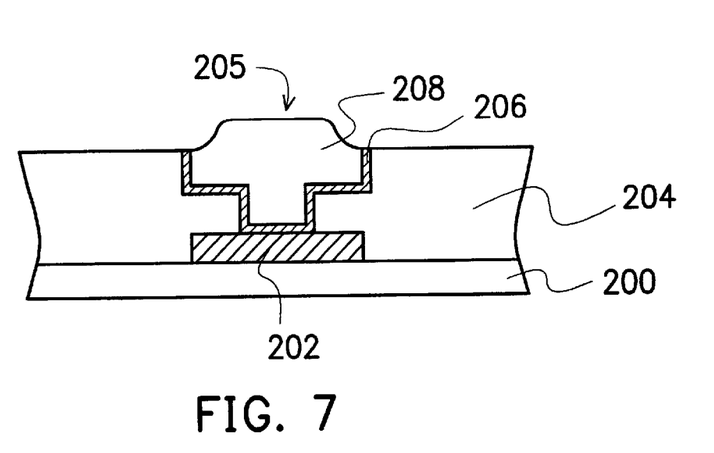

Finally, as shown in FIG. 7, the liner layer 206 is polished using a polishing solution having a high polishing selectivity between the liner layer 206 and the metallic layer 208 until the insulation layer 204 is exposed FIGS. 8 through 12 are cross-sectional views showing the progression of steps for forming a dual damascene structure according to a second preferred embodiment of this invention.

Figure 8:
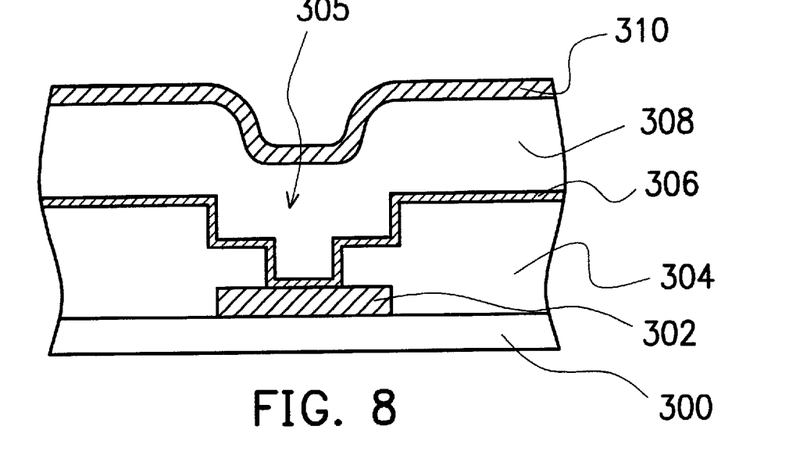

As shown in FIG. 8, a substrate 300 is provided. A metal line 302 is formed over the substrate 300 and an insulation layer 304 is formed over the substrate 300. The insulation layer 304 can be a silicon dioxide layer formed, for example, by plasma-enhanced chemical vapor deposition (PECVD). Photolithographic and etching processes are next conducted in sequence to form a dual damascene opening 305 in the insulation layer 304. A liner layer 306 is formed over the exposed surface of the dual damascene opening 305. The liner layer 306 can be a titanium/titanium-nitride composite layer or a tantalum/tantalum-nitride composite layer. The composite layer is formed, for example, by depositing titanium or tantalum over the opening 305 through a DC magnetron sputtering machine and then performing a nitridation reaction to form a titanium nitride or tantalum nitride layer. In the subsequent step, metal is deposited over the liner layer 306 filling the dual damascene opening 305 to form a metallic layer 308. The metallic layer 308 can be a copper layer, for example. A cap layer 310 is formed over the metallic layer 308. Due to the presence of the dual damascene opening 305, the cap layer 310 above the dual damascene opening 305 is at a level lower than the cap layer 310 around the opening 305.

The cap layer 310 can be produced using materials such as polysilicon, silicon dioxide, silicon nitride, silicon carbide, metals or low dielectric constant materials such as parylene N, polynaphthalene-N and fluorinated hydrocarbon. However, the polishing rate of the cap layer 310 must be considerably lower than the metallic layer 308 when the metallic layer is polished using a metal-reactive solution.

Figure 9:
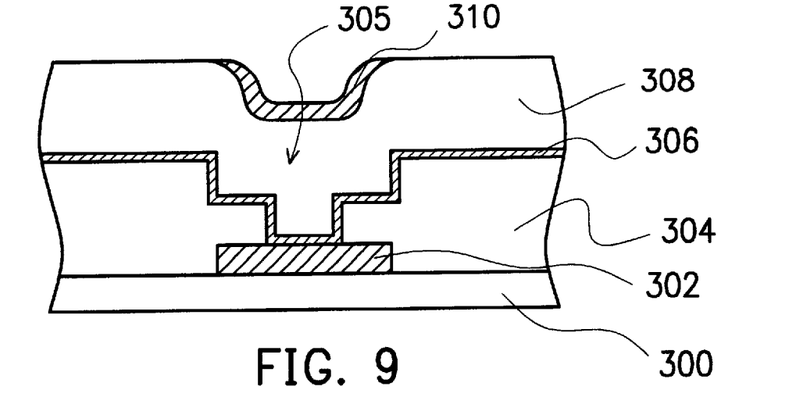

As shown in FIG. 9, a portion of the cap layer 310 lying outside the dual damascene opening 305 is polished away using a cap-layer-reactive solution until the metallic layer 308 is exposed. Here, a cap-layer-reactive solution is used to speed up the removal rate of the cap layer 310 outside the dual damascene opening 305.

Figure 10:
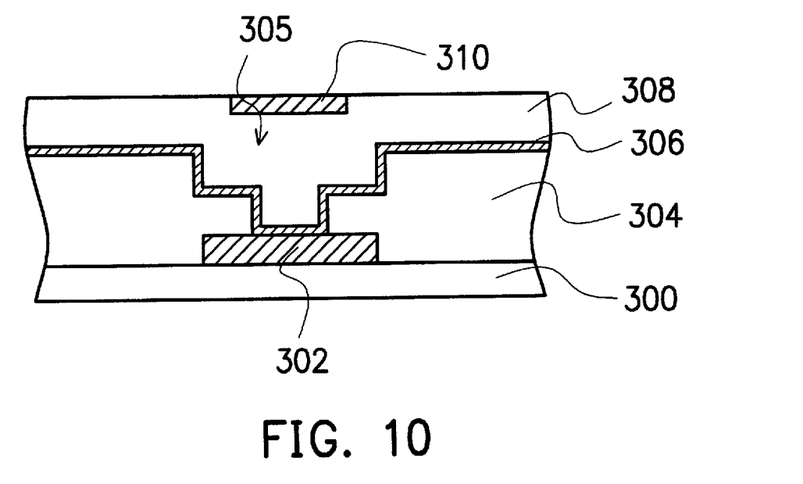

As shown in FIG. 10, the metallic layer 308 is polished using a metal-reactive solution until the metallic layer 308 is at the same height level as the top of the cap layer 310. Since the cap layer 310 has a lower polishing rate than the metallic layer 308, the metallic layer 308 under the retained cap layer 310 is protected from polishing action. Through the protective cap layer 310, dishing at the top of the metallic layer 308 due to over-polishing can be prevented.

Figure 11A:
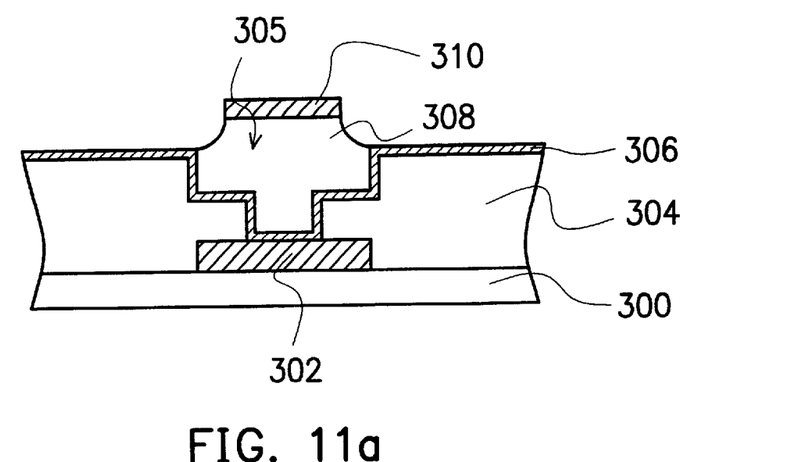
FIG. 11a shows the structure after polishing with a polishing solution having a high polishing selectivity ratio between the metal layer and the cap layer and hence a portion of the cap layer is retained.
Figure 11B:
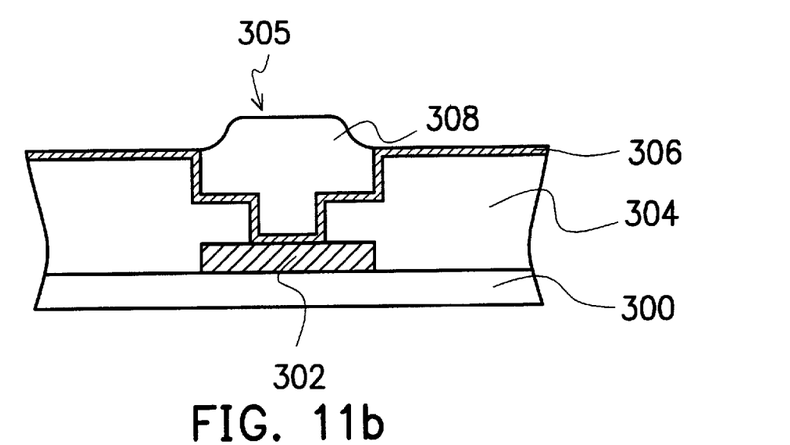
FIG. 11b shows the structure after polishing with a polishing solution having a low polishing selectivity ratio between the metal layer and the cap layer and hence the cap layer is completely removed.

As shown in FIGS. 11a and 11b, the polishing process is continued using metal-reactive solution so that the metallic layer 308 lying outside the cap layer 310 is removed. The polishing process is stopped when the liner layer 306 is exposed. Due to the difference in polishing selectivity between the metallic layer 308 and the cap layer 310, one of two conditions may occur when the liner layer 306 is exposed. If the polishing selectivity ratio between the metallic layer 308 and the cap layer 310 is very high, only a portion of the cap layer 310 will be removed as shown in FIG. 11a. Under such circumstances, an addition step of removing the remaining cap layer 310 to form a protruding metal line structure is required. The cap layer 310 can be removed, for example, by wet etching using a reactant that has a high etching selectivity between the cap layer 310 and the liner layer 306. On the other hand, if the polishing selectivity ratio between the metallic layer 308 and the cap layer 310 is moderate to low, the cap layer 310 will be completely removed. In some cases, a portion of the metallic layer 308 underneath the cap layer 310 is removed similarly forming a protruding metal line structure as shown in FIG. 11b.

Figure 12:
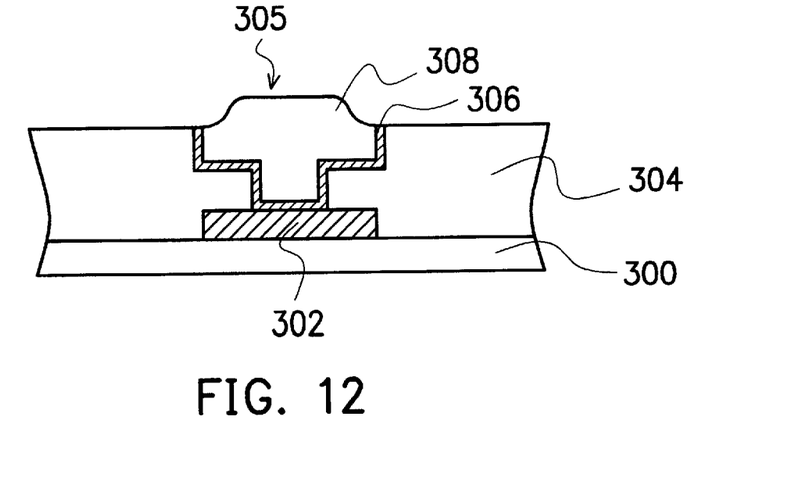

Finally, as shown in FIG. 12, the liner layer 306 is polished using a polishing solution having a high polishing selectivity between the liner layer 306 and the metallic layer 308 until the insulation layer 304 is exposed FIGS. 13 through 16 are cross-sectional views showing the progression of steps for forming a dual damascene structure according to a third preferred embodiment of this invention.

Figure 13:
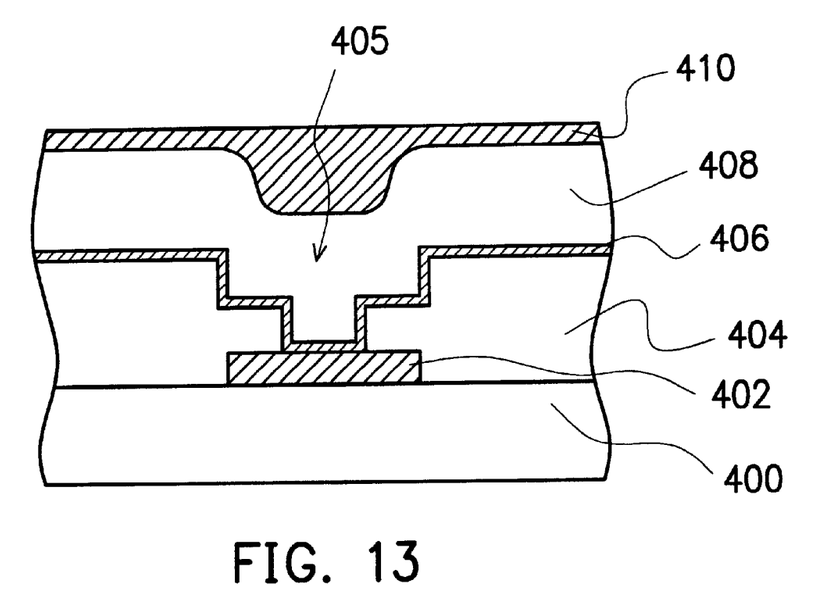

As shown in FIG. 13, a substrate 400 is provided. A metal line 402 is formed over the substrate 400 and an insulation layer 404 is formed over the substrate 400. The insulation layer 404 can be a silicon dioxide layer formed, for example, by plasma-enhanced chemical vapor deposition (PECVD). Photolithographic and etching processes are next conducted in sequence to form a dual damascene opening 405 in the insulation layer 404. A liner layer 406 is formed over the exposed surface of the dual damascene opening 405. The liner layer 406 can be a titanium/titanium-nitride composite layer or a tantalum/tantalum-nitride composite layer. The composite layer is formed, for example, by depositing titanium or tantalum over the opening 405 through a DC magnetron sputtering machine and then performing a nitridation reaction to form a titanium nitride or tantalum nitride layer. In the subsequent step, metal is deposited over the liner layer 406 filling the dual damascene opening 405 to form a metallic layer 408. The metallic layer 408 can be a copper layer, for example. A cap layer 410 is formed over the metallic layer 408 by spin-coating a solution of the solvent. Hence, a plane-top cap layer 410 is obtained. Due to the presence of the dual damascene opening 405, the cap layer 410 above the dual damascene opening 405 is thicker than the cap layer 410 around the opening 405.

The cap layer 410 can be produced using spin-on dielectric materials such as spin-on polymer (SOP) or spin-on glass (SOG), for example, polyimide, polysiloxane, polyquinoline and fluorinated polyimide. Process of fabrication the cap layer 410 includes dissolving the dielectric material in a solvent and spin-coating the solution over the metallic layer 408. However, the polishing rate of the cap layer 410 must be considerably lower than the metallic layer 408 when the metallic layer is polished using a metal-reactive solution.

Figure 14:
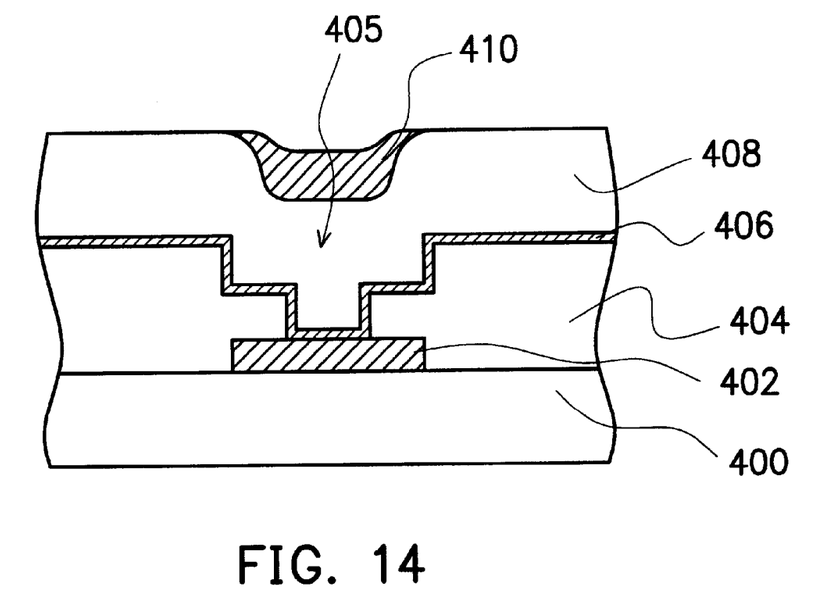

As shown in FIG. 14, a portion of the cap layer 410 lying outside the dual damascene opening 405 is polished away using a cap-layer-reactive solution until the metallic layer 408 is exposed. Since the cap layer 410 above the dual damascene opening 405 is thicker than surrounding area, a portion of the cap layer 410 remains on top of the opening 405 serving as a protective layer.

Figure 15:
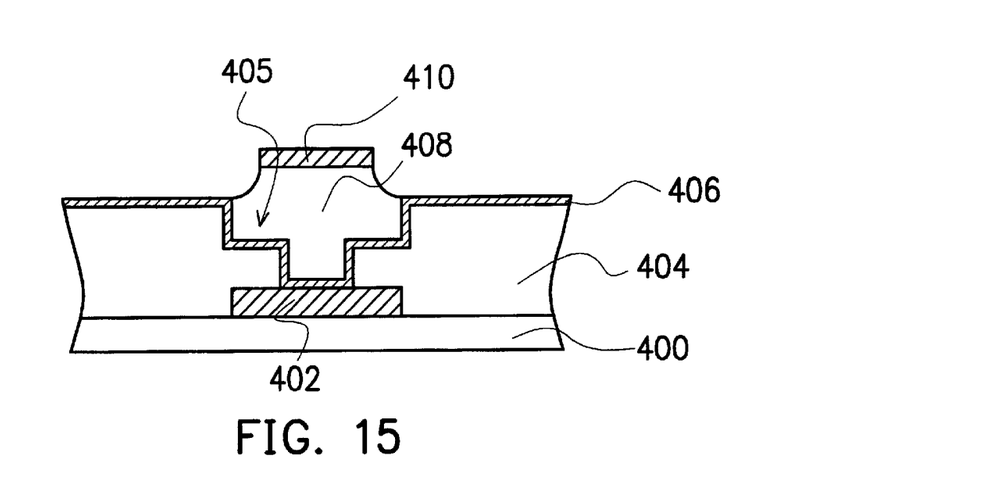

As shown in FIG. 15, the metallic layer 408 is polished using a metal-reactive solution until the liner layer 406 is exposed. In the end, a portion of the cap layer 410 is also polished away but the metallic layer 408 inside the dual damascene opening 405 will remain intact.

Figure 16A:
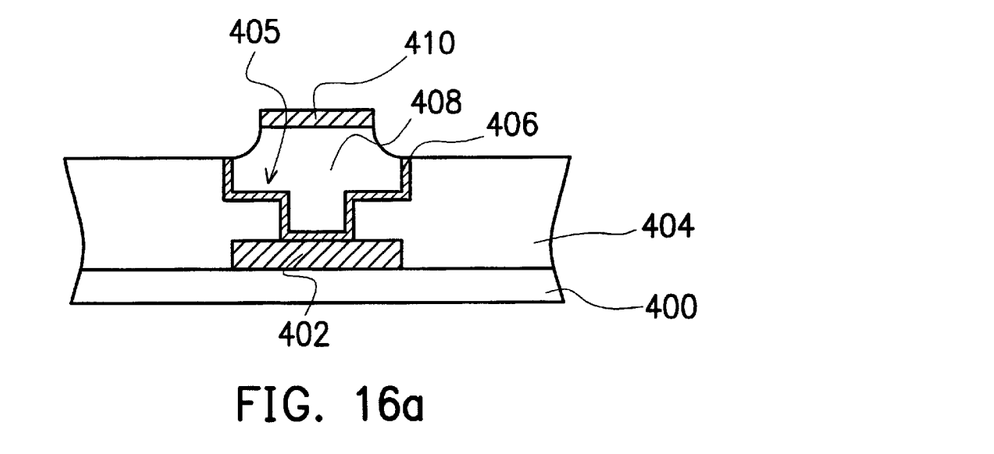
FIG. 16a shows the structure after polishing with a polishing solution having a high polishing selectivity ratio between the metal layer and the cap layer and hence a portion of the cap layer is retained.
Figure 16B:
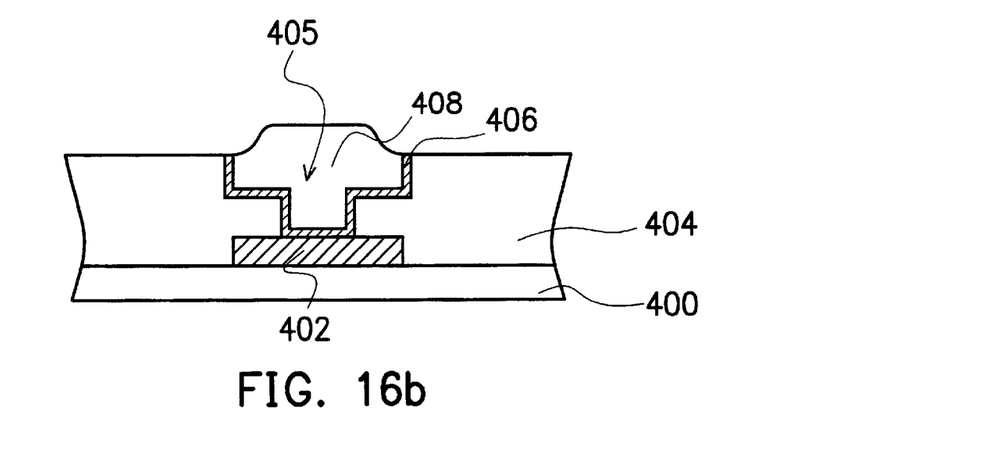
FIG. 16b shows the structure after polishing with a polishing solution having a low polishing selectivity ratio between the metal layer and the cap layer and hence the cap layer is completely removed.

As shown in FIGS. 16a and 16b, the liner layer 406 is polished until the insulation layer 404 is exposed. A polishing solution that has a high polishing selectivity ratio between the liner layer 406 and the metallic layer 408 can be used in the polishing process. Due to the difference in polishing selectivity between the liner layer 406 and the cap layer 410, one of two conditions may occur when the insulation layer 404 is exposed. If the polishing selectivity ratio between the liner layer 406 and the cap layer 410 is very high, only a portion of the cap layer 410 will be removed as shown in FIG. 16a. Under such circumstances, an addition step of removing the remaining cap layer 410 to form a protruding metal line structure is required. The cap layer 410 can be removed, for example, by wet etching using a reactant that has a high etching selectivity between the cap layer 410 and the liner layer 406. On the other hand, if the polishing selectivity ratio between the liner layer 406 and the cap layer 410 is moderate to low, the cap layer 410 will be completely removed. In some cases, a portion of the metallic layer 408 underneath the cap layer 410 is removed similarly forming a protruding metal line structure as shown in FIG. 16b.

By forming a cap layer over a dual damascene opening, the metal line on a dual damascene structure is protected. Consequently, tolerance for chemical-mechanical polishing is increased considerably.

In the first embodiment of this invention, the cap layer has a polishing rate lower than the metallic layer when metal-reactive solution is used to polish the cap layer. Hence, metal line on the dual damascene structure is well protected.

In the second embodiment of this invention, the cap layer has a polishing rate higher than the metallic layer when cap-layer-reactive solution is used to polish the cap layer. Hence, some polishing time is saved.

In the third embodiment of this invention, the cap layer lying over the dual damascene opening is thicker than surrounding region. Therefore, after the cap layer surrounding the opening is complete removed by polishing using metal-reactive solution, a portion of the cap layer will remain to protect the metal line.

In summary, a slightly protruding metal line structure is produced in this invention because of the protection by a cap layer. Therefore, dishing of metal line due to over-polishing can be prevented. Moreover, without dishing, the upper metal line can have a larger cross-section. Hence, resistance of metal lines is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a dual damascene structure, comprising the steps of:
   providing a substrate;
   forming a metal line over the substrate;
   forming an insulation layer over the substrate;
   forming a dual damascene opening in the insulation layer such that a portion of the metal line is exposed;
   forming a liner layer over the exposed surface of the dual damascene opening;
   depositing metallic material over the liner layer and filling the dual damascene opening to form a metallic layer;
   forming a cap layer over the metallic layer;
   performing a first chemical-mechanical polishing operation to remove the cap layer outside the dual damascene opening and the metallic layer until the cap layer above the dual damascene opening is exposed;
   performing a second chemical-mechanical polishing operation to remove the metallic layer outside the cap layer protected dual damascene opening until the liner layer is exposed;
   after the second chemical-mechanical polishing operation, removing the cap layer by wet etching; and
   performing a third chemical-mechanical polishing to remove the liner layer, wherein the polishing rate of the liner layer and the insulation layer is substantially higher compared to the metallic layer so that a protruding metal line structure is formed.

2. The method of claim 1, wherein the cap layer has a polishing rate smaller than the metallic layer in the first chemical-mechanical polishing operation.

3. The method of claim 1, wherein the step of performing the first chemical-mechanical polishing operation includes the sub-steps of:
   polishing the cap layer outside the dual damascene opening using a cap-layer-reactive solution until the metallic layer is exposed; and
   polishing the metallic layer using metal-reactive solution until the metallic layer is at the same height level as the cap layer above the dual damascene opening.

4. The method of claim 1, wherein the step of forming the cap layer includes depositing silicon carbide.

5. The method of claim 1, wherein the step of forming the cap layer includes depositing a low dielectric constant material.

6. The method of claim 1, wherein the step of forming the cap layer includes depositing silicon nitride.

7. The method of claim 1, wherein the second chemical-mechanical polishing operation is carried out using a metal-reactive solution.

8. The method of claim 1, wherein the third chemical-mechanical polishing operation is carried out using a reactive solution having a high selectivity ratio between the liner layer and the cap layer.

9. A method of fabricating a dual damascene structure, comprising the steps of:
   providing a substrate;
   forming a metal line over the substrate;
   forming an insulation layer over the substrate;
   forming a dual damascene opening in the insulation layer such that a portion of the metal line is exposed;
   forming a liner layer over the exposed surface of the dual damascene opening;
   depositing metallic material over the liner layer and filling the dual damascene opening to form a metallic layer;
   forming a cap layer with a planar upper surface over the metallic layer;
   performing a first chemical-mechanical polishing operation using a cap-layer-reactive solution to remove the cap layer until the metal layer is exposed;
   performing a second chemical-mechanical polishing operation to remove the metallic layer outside the cap layer protected dual damascene opening until the liner layer is exposed; and
   performing a third chemical-mechanical polishing to remove the liner layer, wherein the polishing rate of the liner layer and the insulation layer is substantially higher compared to the metallic layer so that a protruding metal line structure is formed.

10. The method of claim 9, wherein material forming the cap layer includes spin-on glass.

11. The method of claim 9, wherein material forming the cap layer includes spin-on polymer.

12. The method of claim 9, wherein after the step of performing the third chemical-mechanical polishing operation, further includes removing the cap layer by wet etching.

* * * * *